(12) United States Patent
Kitanaka

(10) Patent No.: US 8,525,486 B2
(45) Date of Patent: Sep. 3, 2013

(54) POWER CONVERTER

(75) Inventor: Hidetoshi Kitanaka, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 385 days.

(21) Appl. No.: 13/063,692

(22) PCT Filed: Nov. 20, 2008

(86) PCT No.: PCT/JP2008/071125
§ 371 (c)(1),
(2), (4) Date: Mar. 11, 2011

(87) PCT Pub. No.: WO2010/058468
PCT Pub. Date: May 27, 2010

(65) Prior Publication Data
US 2011/0175577 A1   Jul. 21, 2011

(51) Int. Cl.
*H02J 7/06* (2006.01)
*H02J 7/24* (2006.01)

(52) U.S. Cl.
USPC .......................................... 320/163; 320/137

(58) Field of Classification Search
USPC .............................................................. 320/163
See application file for complete search history.

(56) References Cited

U.S. PATENT DOCUMENTS

| | | | |
|---|---|---|---|
| 6,563,290 B2 * | 5/2003 | Sakakibara et al. | 320/106 |
| 7,012,405 B2 * | 3/2006 | Nishida et al. | 320/137 |
| 2001/0052760 A1 * | 12/2001 | Amano et al. | 320/163 |
| 2008/0094036 A1 * | 4/2008 | Yamashita et al. | 320/162 |
| 2009/0039837 A1 * | 2/2009 | Suzuki | 320/152 |
| 2010/0127669 A1 * | 5/2010 | Iida | 320/162 |

FOREIGN PATENT DOCUMENTS

| | | |
|---|---|---|
| EP | 1 679 523 A1 | 7/2006 |
| JP | 09-289737 A | 11/1997 |
| JP | 09-312939 A | 12/1997 |
| JP | 2000-299939 A | 10/2000 |
| JP | 2003-243044 A | 8/2003 |
| JP | 2004-282799 A | 10/2004 |
| JP | 2006-176057 A | 7/2006 |
| JP | 2007-274756 A | 10/2007 |
| JP | 2008-092729 A | 4/2008 |
| JP | 2008-228420 A | 9/2008 |
| RU | 2 283 504 C1 | 9/2006 |

OTHER PUBLICATIONS

Office Action (Decision on Grant a Patent for Invention) dated Aug. 17, 2012, issued by the Russian Patent Office in the corresponding Russian Patent Application No. 2011124915 and partial English translation thereof. (13 pages).

(Continued)

*Primary Examiner* — Arun Williams
(74) *Attorney, Agent, or Firm* — Buchanan Ingersoll & Rooney PC

(57) ABSTRACT

A power conversion controller includes: a correction-value calculating unit that calculates a correction value DE2 to correct a voltage value BEFC from a voltage signal BEFC that is obtained by converting the voltage value BEFC detected by a first voltage detector into a digital signal by an A/D converter and from a series-total voltage value EBAT detected by a second voltage detector; a corrected-voltage calculating unit that calculates a voltage signal BEFC1 as a corrected voltage value that is obtained by correcting the voltage value BEFC by the correction value DE2; and a gate controller that controls a power converting unit based on the voltage signal BEFC1.

21 Claims, 5 Drawing Sheets

(56) References Cited

OTHER PUBLICATIONS

The extended European Search Report dated Apr. 26, 2012, issued in corresponding European Patent Application No. 08878265.1. (5 pages).
International Search Report (PCT/ISA/210) issued on Feb. 3, 2009, by Japanese Patent Office as the International Searching Authority for International Application No. PCT/JP2008/071125.
Written Opinion (PCT/ISA/237) issued on Feb. 3, 2009, by Japanese Patent Office as the International Searching Authority for International Application No. PCT/JP2008/071125.
Office Action (Notice of Rejection) dated Aug. 4, 2009, issued in the corresponding Japanese Patent Application No. 2009-516432, and an English Translation thereof.

* cited by examiner

POWER CONVERTER

TECHNICAL FIELD

The present invention relates to a power converter that is suitable for application for an electric rolling stock.

BACKGROUND ART

Generally, an electric rolling stock is configured to take in electric power from a wire or a third rail by a power collector and run by driving a motor by using the collected power. In recent years, performance of electric-power storage elements such as a secondary battery and an electric double-layer capacitor has been improved. Therefore, there has been a development of a system that runs by driving a motor by concurrently using electric power of these electric-power storage elements mounted on an electric rolling stock.

Such a system includes an electric-power storage device configured to obtain a predetermined voltage by connecting plural electric-power storage elements as cells or modules of a secondary battery and an electric double-layer capacitor. A power converter to perform a control of electric charge/discharge is connected between an external power source and the electric-power storage device in order to electrically charge to and discharge from the electric-power storage device (for example, see Patent Documents 1 and 2).

There are various circuit modes as a power converting unit that constitutes a power converter. For example, as major ones of these circuit modes, there can be mentioned a DC-DC converter circuit having a function of performing electric charge/discharge by controlling power between a direct-current power source and a power storage unit at a predetermined value, a DC-AC inverter circuit having a function of electrically charging to an electric-power storage device by converting regenerative power generated from an alternating-current motor into direct current power and driving the alternating-current motor by converting direct current power of the electric-power storage device into alternate current power, and an AC-DC converter having a function of performing electric charge/discharge by controlling power between an alternating-current power source and an electric-power storage device at a predetermined value.

The power converter described above is generally configured to have a voltage detector (hereinafter, "first voltage detector") that detects a voltage at a connection point between a power converter and an electric-power storage device and to perform an electric charge/discharge control of the electric-power storage device based on a voltage detected by this first voltage detector.

An electric-power storage element used in the electric-power storage device has a characteristic that a terminal voltage changes depending on an electric charge amount (SOC: State of Charge), and has a characteristic that the terminal voltage becomes higher when the SOC is higher. Therefore, a power converter that includes the electric-power storage device is set with a permissible maximum voltage that becomes an upper limit and a permissible minimum voltage that becomes a lower limit in a terminal voltage of each electric-power storage element in order to prevent damage due to an over electric discharge from and an over electric charge to each electric-power storage element. The power converter controls to reduce a charging current such that a voltage detected by the first voltage detector does not exceed the permissible maximum voltage, and also controls to reduce a discharging current such that the detected voltage does not become lower than the permissible minimum voltage.

Meanwhile, respective electric-power storage elements incorporated in the electric-power storage device is provided with a voltage detector in respective cell units or module units. The electric-power storage device that includes respective electric-power storage elements is generally configured to have a function of detecting and monitoring a voltage of respective electric-power storage elements and notifying an abnormality to a higher-order system by outputting an indication of the state to the system when a detected voltage exceeds or becomes lower than a predetermined value, and a monitoring function called a cell monitor or the like detecting an occurrence of a variation in voltages between cells or between modules to equalize the voltages such that the variation is suppressed.

The first voltage detector that detects a voltage at a connection point between the first voltage detector and the electric-power storage device is required to have a performance that can withstand a high voltage such that the first voltage detector can detect a voltage of about several hundred to one thousand volts. A main object of this voltage detector is to control a voltage of the power converter at a high speed. Although a response delay of an input/output is as small as 0.3 microsecond, an error of the voltage detection precision is as high as about ±3%. Generally, a voltage detector that can detect a high voltage tends to have poor detection precision because its internal insulating unit and the like are complex.

Besides, a voltage detector (hereinafter, "second voltage detector") that monitors a voltage of an electric-power storage element detects a voltage of several to several tens of volts as a cell voltage or a module voltage. A main object of this voltage detector is to protect respective cells or modules from an over electric discharge and an over electric charge by monitoring the voltage of respective cells or modules in high precision. Therefore, although a response delay of an input/output is as large as several tens of microseconds, an error of the detection precision of a voltage is as high as about ±0.3%.

An example in which a power converter electrically charges to an electric-power storage element is explained below. When the SOC of the electric-power storage element is low and when a terminal voltage has a sufficiently apart from its upper limit value, a constant-current electric charge (CC (Constant Current) electric charge) of electrically charging to the electric-power storage element at a constant current is performed. When the SOC increases and when the terminal voltage reaches approximately to a permissible maximum voltage, the CC electric charge is switched to constant-voltage electric charge (CV (Constant Voltage) electric charge), such that the terminal voltage does not exceed the upper limit value. Electric charge is continuously performed by reducing a current such that a voltage of the electric-power storage element is maintained at a predetermined value while not exceeding the permissible maximum voltage.

Patent Document 1: Japanese Patent Application Laid-open No. 2007-274756
Patent Document 2: Japanese Patent Application Laid-open No. 2006-176057

DISCLOSURE OF INVENTION

Problem to be Solved by the Invention

When CV electric charge is performed, the power converter is controlled by setting a target voltage such that a detected voltage value of the first voltage detector becomes a maximum voltage while not exceeding the permissible maximum voltage of the electric-power storage element. The target voltage in this case needs to be determined by considering a maximum tolerance of the detection precision of the first voltage detector. That is, when a permissible maximum voltage of an electric-power storage device that is configured by connecting plural electric-power storage elements is 700 volts (V), a detection error of 700 V×0.03=21 V exists when a tolerance of 3% is considered. Therefore, the target voltage needs to be set equal to or lower than 700 V−21 V=679 V by taking the detection error into consideration.

However, the detection error of 21 volts is a value that does not need to be considered when the tolerance of the first voltage detector is zero, for example. The charging current is excessively reduced when the detection error is larger, and thus there occurs an inconvenience such that an electric charging time is taken longer than usual.

In order to eliminate the above inconvenience, the detection precision of the first voltage detector needs to be improved; however, because a voltage detector that can detect a high voltage tends to have poor detection precision as described above, it is technically difficult to improve the detection precision of the first voltage detector.

The present invention has been achieved in view of the above problems, and an object of the present invention is to provide a power converter that can shorten a time of electrically charging to an electric-power storage element and can efficiently perform electric charge/discharge, even when a detector having not so high detection precision is used as a first voltage detector that detects a voltage at a connection point between the first voltage detector and an electric-power storage device.

Means for Solving Problem

In order to solve the above problem and in order to attain the above object, a power converter of the present invention including a power converting unit that is connected to an electric-power storage device to which a plurality of electric-power storage elements are connected and performs electric charge/discharge to and from the electric-power storage device, and a power conversion controller that controls an operation of the power converting unit, wherein the power conversion controller includes: a correction-value calculating unit that calculates a correction value or a correction coefficient from a first voltage value detected by a first voltage detector that detects a voltage at a connection point between the power converting unit and the electric-power storage device and from a second voltage value detected by a second voltage detector that is incorporated in the electric-power storage device and detects a voltage in a cell unit or a module unit in each of the electric-power storage elements and having higher precision than that of the first voltage value and having a late response; and a corrected-voltage calculating unit that calculates a corrected voltage value obtained by correcting the first voltage value by the correction value or the correction coefficient, a control of the power converting unit is performed based on the corrected voltage value, and the power converter has a configuration of performing constant-voltage electric charge to the electric-power storage device.

Effect of the Invention

According to the power converter of the present invention, the power converting unit is controlled based on a corrected voltage-detection value that is a corrected detection voltage of the first voltage detector that detects a voltage at a connection point between the power converter and the electric-power storage device. Therefore, a time of electrically charging to the electric-power storage element can be shortened, and efficient electric charge/discharge can be performed.

Figure 1:
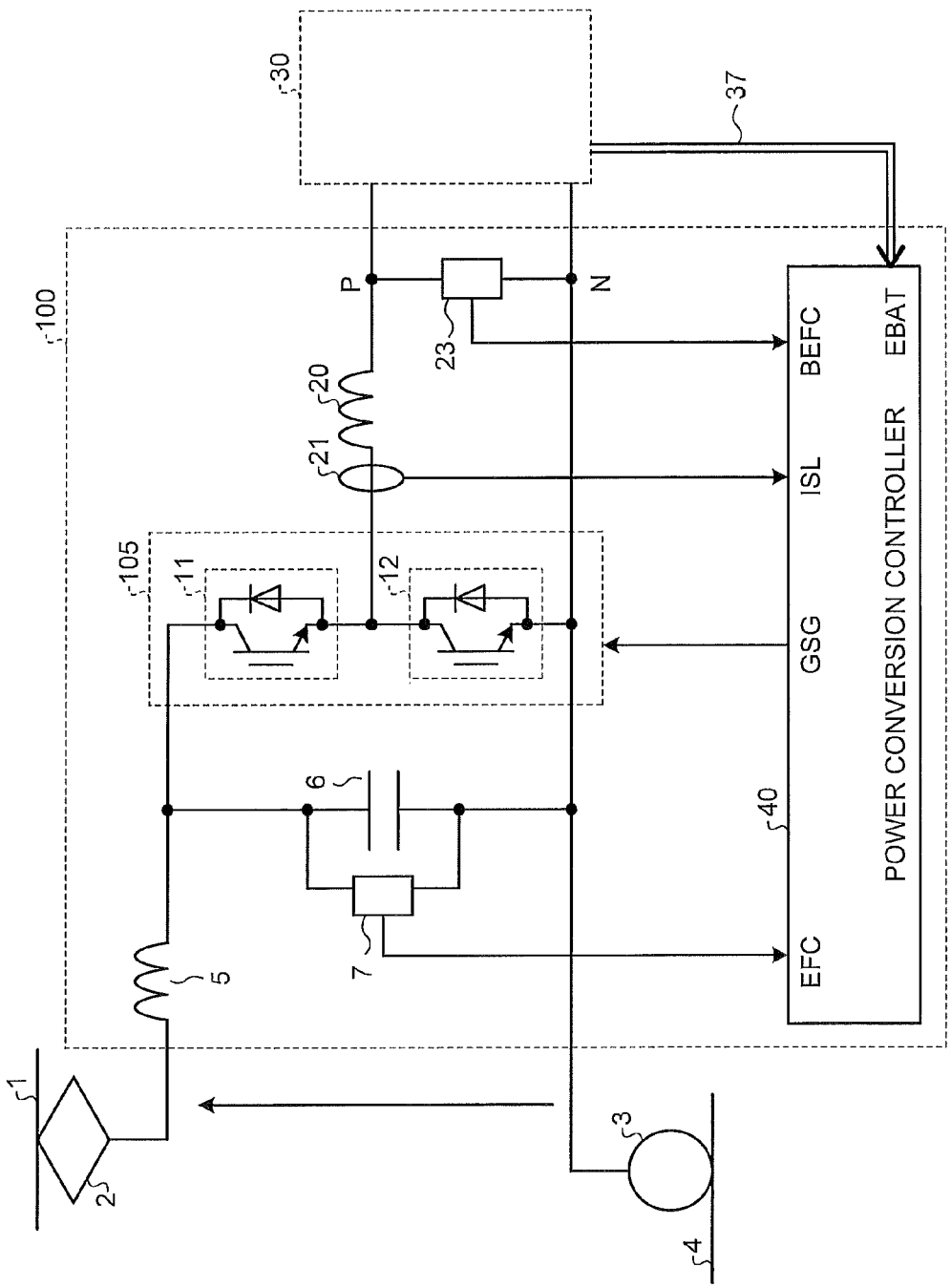
FIG. 1 is a configuration example of a power converter according to an embodiment of the present invention.

EXPLANATIONS OF LETTERS OR NUMERALS 1 wire
2 power collector
3 wheel
4 rail
5 reactor
6 capacitor
7 voltage detector
11 upper-arm-side switching element
12 lower-arm-side switching element
20 smoothing reactor
21 current detector
23 first voltage detector
30 electric-power storage device
31$a$ to 31$n$ electric-power storage element
32$a$ to 32$n$ second voltage detector
33 electric-power storage controller
34 A/D converting unit
35 adding unit
36 communication processing unit
37 signal transmission path
40, 40$a$ power conversion controller
41 adder
42 protection processing unit
44 gate controller
45 A/D converter
50 correction-value calculating unit
51 averaging processing unit
52 averaging processing unit
53 subtracting unit
54 limiter
55 switch (correction selecting unit)
56 data monitoring unit
57 communication processing unit
60 corrected-voltage-value calculating unit
100 power converter
105 power converting unit (DC-DC converter)
110 power converting unit (AC-DC converter)
115 capacitor
120 power converting unit (DC-AC inverter)
200 external power source
300 motor

BEST MODE(S) FOR CARRYING OUT THE INVENTION

Exemplary embodiments of a power converter according to the present invention will be explained below in detail with reference to the accompanying drawings. The present invention is not limited to the embodiments.

FIG. 1 is a configuration example of a power converter according to an embodiment of the present invention. In FIG. 1, a power converter 100 according to the present embodiment is connected to a wire 1 connected to an electric-power substation (not shown) as a direct-current power source, a power collector 2 that collects power from the wire 1, a wheel 3 that becomes a return circuit of a return current, and a rail 4 that is connected to the electric-power substation. A voltage supplied from the wire 1 is a high voltage of DC600 volts to 3000 volts.

Main circuit configuration elements constituting the power converter 100 include: an LC filter circuit constituted by a reactor 5 as an input reactor to suppress a flow out of a higher harmonic current to an electric-power substation side, and a capacitor 6 as an input capacitor; a voltage detector 7 that detects a direct-current voltage EFC of the capacitor 6; a power converting unit 105 that is connected in parallel to the capacitor 6, and constituted by an upper-arm-side switching element 11 and a lower-arm-side switching element 12; a smoothing reactor 20 as a smoothing filter of which one end is connected to a connection point between the upper-arm-side switching element 11 and the lower-arm-side switching element 12, and which performs filtering of a current ripple; a current detector 21 that detects a current value ISL of the smoothing reactor 20; a voltage detector 23 as a first voltage detector that detects a voltage between main circuit conductors P and N at a connection position between the power converter 100 and an electric-power storage device 30; and a power conversion controller 40 that is input with voltage values EFC and BEFC or the current value ISL from the detectors or a voltage value EBAT detected by second voltage detectors 32a to 32n incorporated in the electric-power storage device 30, and outputs a control signal to the power converting unit 105. The power converter 100 is connected to the electric-power storage device 30 that stores direct current power.

The first voltage detector 23 is a detector in a specification that can withstand a high voltage such that the first voltage detector 23 can detect a voltage of about several hundred to one thousand volts. The first voltage detector 23 converts a voltage between the main circuit conductors P and N into a low-voltage analog signal level via an insulating unit (not shown), and outputs a conversion result as a voltage detection value BEFC. A main object of the first voltage detector 23 is to detect a minimum delay voltage in order to control the voltage between the main circuit conductors P and N at a high speed.

The first voltage detector 23 performs analog signal processing in most of its internal configuration. Therefore, although a response delay of an input and an output is as small as about several hundred microseconds, an error of the detection precision of a voltage is about ±3% and thus a voltage detection error is relatively large. Generally, a voltage detector that can detect a high voltage tends to have poor detection precision because an internal insulating unit and the like become complex.

Figure 2:
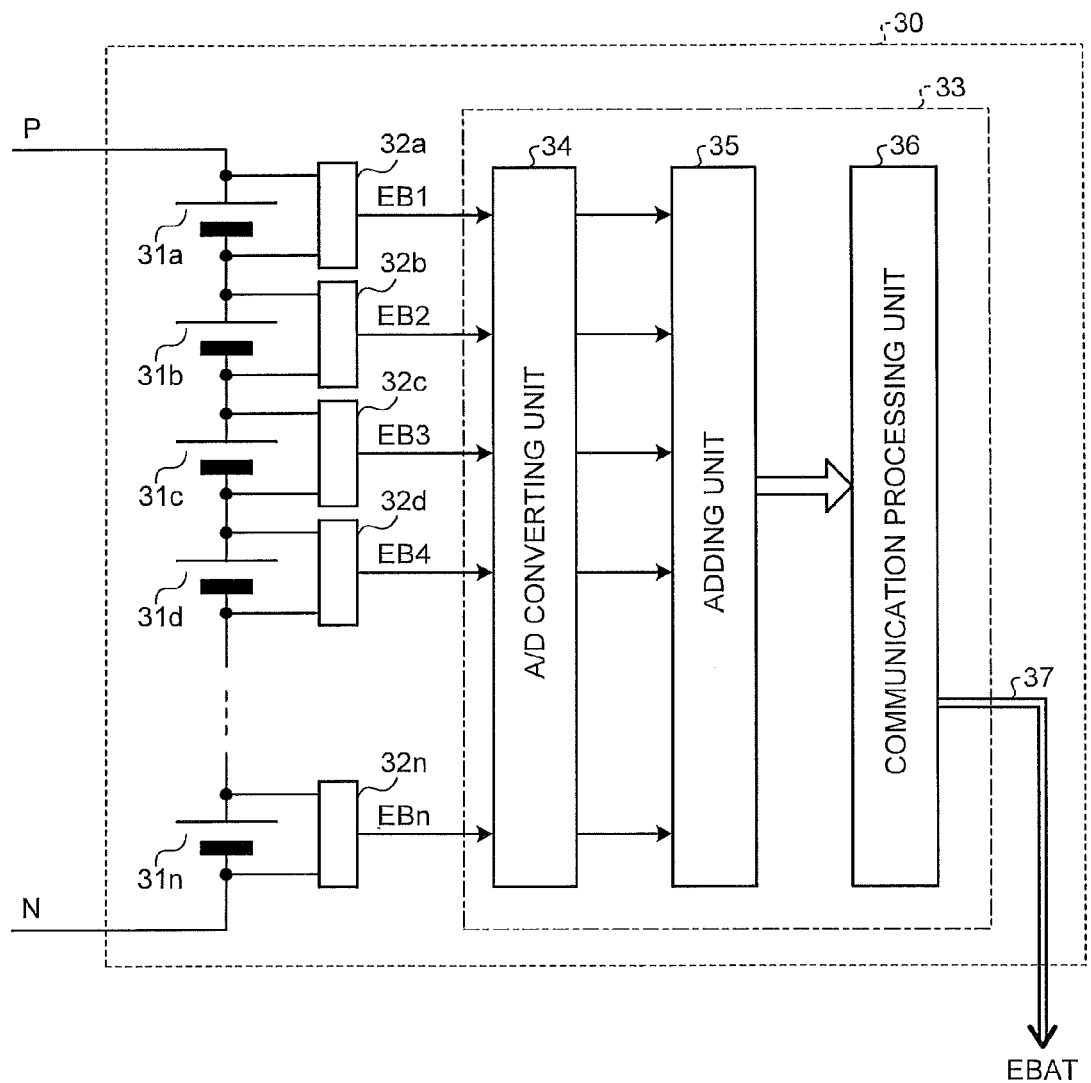
FIG. 2 is a configuration example of an electric-power storage device according to the embodiment of the present invention.

FIG. 2 is a configuration example of the electric-power storage device 30 according to the embodiment of the present invention. As shown in FIG. 2, the main circuit conductors P and N from the power converter 100 are connected to electric-power storage elements 31a to 31n connected in series. In FIG. 2, electric-power storage elements 31 are shown by a symbol of a battery. Although a nickel-hydride secondary battery, a lithium-ion secondary battery, an electric double-layer capacitor and the like are suitable for the electric-power storage elements 31a to 31n, applicable batteries are not limited to these and other electric-power storage units can be also used. In FIG. 2, although the electric-power storage elements 31 are shown by a symbol of a battery, a mode of the electric-power storage elements 31 can be a single cell or can be a module as a connected unit of plural cells.

Voltages at both ends of each of the electric-power storage elements 31a to 31n are detected by the voltage detectors 32a to 32n as the second voltage detectors, respectively, and are input as voltage detection values EB1 to EBn, respectively to an electric-power storage controller 33.

The electric-power storage controller 33 is configured to include: an A/D converting unit 34 that converts an analog signal into a digital signal; an adding unit 35 that generates a sum of the voltage detection values EB1 to EBn input from the A/D converting unit 34; and a communication processing unit 36 that performs a communication process such as a serial data conversion to a series-total voltage value EBAT as the sum of the voltage detection values EB1 to EBn input from the adding unit 35, and thereafter outputs a processed result to a signal transmission path 37 as a transmitting unit of a digital signal configured by a cable, an optical fiber or the like.

An insulating unit (not shown) that performs an insulation process between each of the electric-power storage elements 31a to 31n and the signal transmission path 37 is provided within the electric-power storage controller 33 when necessary.

The electric-power storage controller 33 and the power conversion controller 40 within the power converter 100 communicate with each other in a constant cycle, and the electric-power storage controller 33 transmits data of a value of the above series-total voltage value EBAT to the power conversion controller 40.

By providing the above configuration, various operation processes (such as an addition process and a communication process) can be digitally processed, and the precision of the series-total voltage value EBAT can be secured.

Instead of providing the adding unit 35 within the electric-power storage controller 33, the communication processing unit 36 can be configured to perform a communication process such as a serial data conversion of the voltage detection values EB1 to EBn, and thereafter output a result of the communication process to the signal transmission path 37 as a transmitting unit of a digital signal configured by a cable or an optical fiber.

In this case, a configuration can be such that the electric-power storage controller 33 and the power conversion controller 40 communicate with each other in a constant cycle, the electric-power storage controller 33 transmits data of the voltage detection values EB1 to EBn to the power conversion controller 40, and the power conversion controller 40 generates a value corresponding to the series-total voltage value EBAT as a sum of the voltage detection values EB1 to EBn.

The second voltage detectors 32a to 32n detect a voltage of several to several tens of volts as a cell voltage or a module voltage of each of the electric-power storage elements 31a to 31n. A main object of the second voltage detectors 32a to 32n is to protect the electric-power storage elements 31a to 31n from an over electric charge (excess voltage) or an over electric discharge (low voltage) by monitoring a voltage of each of the electric-power storage elements 31a to 31n in high precision.

The series-total voltage value EBAT is a signal generated via an A/D conversion process, an insulation process, an addition process, and a communication process, as described above. Therefore, although a response delay is as large as several tens of microseconds, an error of the precision of a voltage value is as high as about ±0.3%.

Figure 3:
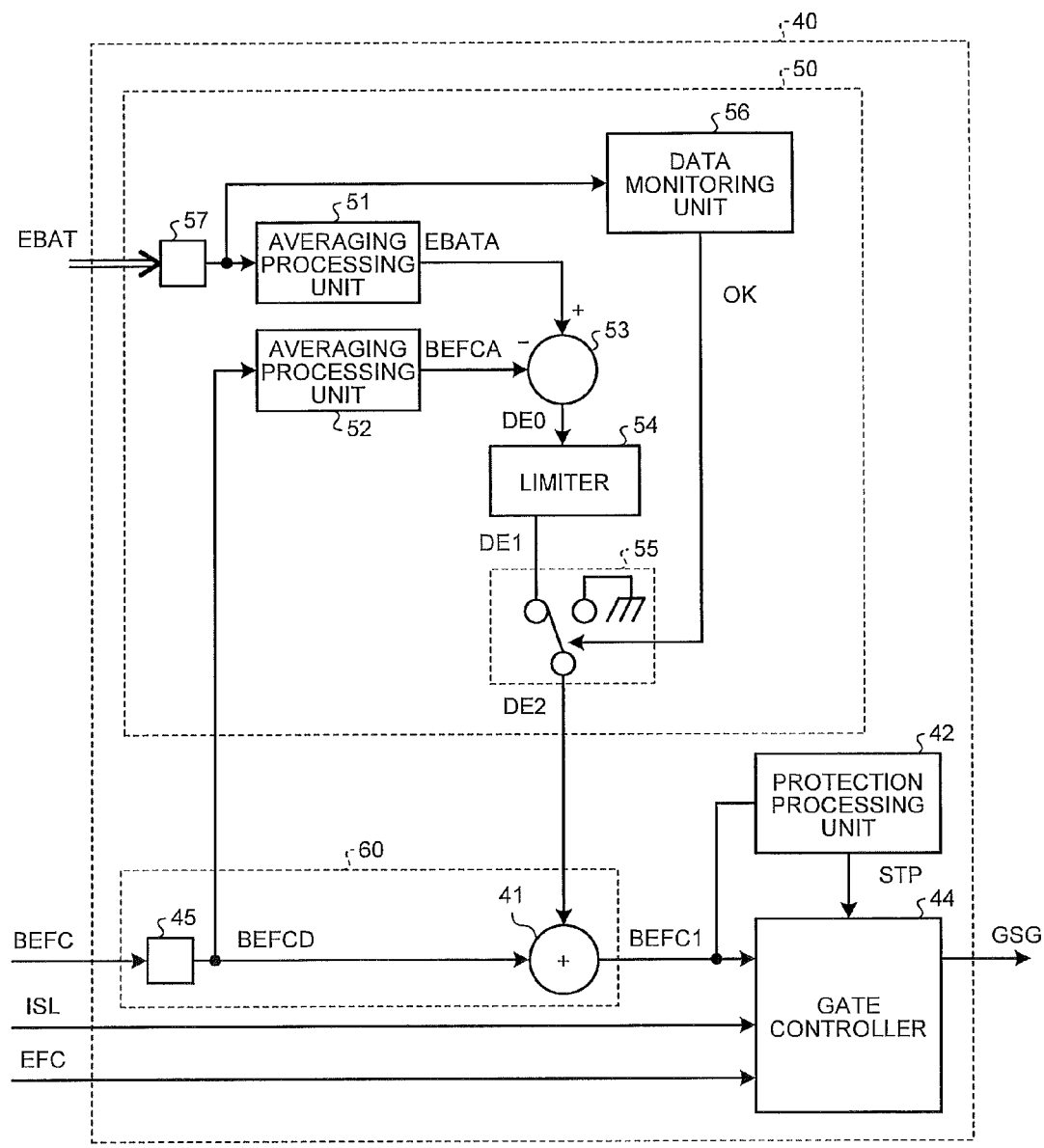
FIG. 3 is a configuration example of a power conversion controller according to the embodiment of the present invention.

FIG. 3 is a configuration example of the power conversion controller 40 according to the embodiment of the present invention. As shown in FIG. 3, the power conversion controller 40 includes a correction-value calculating unit 50, a corrected-voltage-value calculating unit 60 having an A/D converter 45 and an adder 41, a protection processing unit 42, and a gate controller 44. The power conversion controller 40 is input with the series-total voltage value EBAT, the voltage value BEFC, the current value ISL, and the voltage value EFC, and outputs the control signal GSG to the power converting unit 105.

A configuration and an operation of the correction-value calculating unit 50 are explained next. The correction-value calculating unit 50 includes averaging processing units 51 and 52, a subtracting unit 53, a limiter 54, a switch 55 as a correction selecting unit, a data monitoring unit 56, and a communication processing unit 57.

The correction-value calculating unit 50 is input with the series-total voltage value EBAT input from the electric-power storage device 30 via the signal transmission path 37, and a voltage signal BEFCD obtained by converting the voltage BEFC detected by the first voltage detector 23 into a digital signal by the A/D converter 45.

In the correction-value calculating unit 50, the communication processing unit 57 performs a data conversion process such as a serial-parallel conversion to the series-total voltage value EBAT input via the signal transmission path 37, and the averaging processing units 51 and 52 average the series-total voltage value EBAT output from the communication processing unit 57 and the voltage signal BEFCD output from the A/D converter 45, respectively. The averaging processing units 51 and 52 output averaged results as averaged voltage values EBATA and BEFCA, respectively to the subtracting unit 53. The subtracting unit 53 calculates a voltage deviation DE0 that is a difference between the averaged voltage values EBATA and BEFCA.

The voltage deviation DE0 is input to the limiter 54. The limiter 54 then performs a process of limiting an upper limit value and a lower limit value of the voltage deviation DE0 at a predetermined value, and outputs a voltage deviation DE1. The voltage deviation DE1 becomes a correction value DE2 via the switch 55.

The switch 55 is a constituent element having a function of outputting the voltage deviation DE1 as the correction value DE2 when a correction permission signal OK from the data monitoring unit 56 described later is H (permitted) and setting the correction value DE2 at zero when the correction permission signal OK is L (not permitted). The switch 55 operates as a correction selecting unit.

The data monitoring unit 56 has a function of monitoring whether a digital signal of the series-total voltage value EBAT is abnormal, and monitoring whether there is data damage in a signal transmission path of each of constituent elements of the electric-power storage controller 33, the signal transmission path 37, and the communication processing unit 57. At this time, the data monitoring unit 56 sets the correction permission signal OK at H (permitted) when the digital signal is normal, and sets the correction permission signal OK at L (not permitted) when the digital signal is abnormal.

By providing the limiter 54, the correction value DE2 can be prevented from greatly deviating from a normal value even when an abnormal value is calculated in processing at an upstream.

By providing the data monitoring unit 56 and the switch 55, an occurrence of damage such as breakage of the power converter 100 and the electric-power storage device 30 can be prevented by controlling not to use the correction value DE2 for a correction when there is data damage in the signal transmission path of each of constituent elements of the electric-power storage controller 33, the signal transmission path 37, and the communication processing unit 57.

The correction value DE2 generated as described above is input to the corrected-voltage-value calculating unit 60. The adder 41 adds the correction value DE2 to the voltage signal BEFCD, and generates a voltage signal BEFC1. The voltage signal BEFC1 is input as a corrected voltage value to the protection processing unit 42 and the gate controller 44.

A calculation method of the correction value DE2 is not limited to the above contents. For example, there can be used a method that a divider (not shown) is provided instead of the subtracting unit 53, that a ratio of EBATA to BEFCA as the averaged voltage values (=EBATA/BEFCA) is calculated as an error ratio (correction coefficient), and that the correction value DE2 is generated according to this error ratio. In this case, preferably, the voltage signal BEFC1 is generated by multiplying the error ratio to the voltage signal BEFCD. Needless to mention, functions of the limiter 54 and the switch 55 are identical to the above contents.

The voltage signal BEFC1 as a corrected voltage value generated in this way becomes a voltage signal obtained by applying a correction of an average deviation of the voltage value BEFC and the series-total voltage value EBAT (that is, an average error of the first voltage detector 23) to the voltage BEFC detected by the first voltage detector 23. A voltage detection error is small because the voltage signal BEFC1 is generated based on the voltage BEFC. Therefore, the voltage signal BEFC1 becomes a voltage signal having a small voltage-detection delay and high voltage precision.

The protection processing unit 42 input with the voltage signal BEFC1 sets a stop signal STP at "H" and outputs the stop signal STP to the gate controller 44, when the voltage signal BEFC1 is equal to or higher than a predetermined value equal to or lower than a permissible maximum voltage of the electric-power storage elements 31 or when the voltage signal BEFC1 is equal to or lower than a predetermined value equal to or higher than a permissible minimum voltage.

The gate controller 44 input with the voltage signal BEFC1 has a feedback controller (not shown) that on/off controls the switching elements 11 and 12 of the power converting unit 105 such that an output voltage (a voltage between P and N) of the power converter 100 becomes a predetermined value as a control target value, for example, and generates the control signal GSG (a control signal that becomes an on/off instruction to the switching elements 11 and 12) output as a result of the feedback control.

The gate controller 44 off-controls the control signal GSG when the stop signal STP is "H". Therefore, when the protection processing unit 42 detects an excess voltage of the voltage signal BEFC1 exceeding a voltage limit of the electric-power storage elements 31 or a low voltage, for example, the gate controller 44 can stop the operation of the power converting unit 105. By this control, an over electric charge to or an over electric discharge from the electric-power storage elements 31 can be avoided.

FIG. 3 depicts a configuration in which the current value ISL flowing to a smoothing reactor and the voltage value EFC as a direct-current voltage of the capacitor 6 are input together. However, the configuration is not limited thereto, and can be a configuration such that voltage values and current values corresponding to these values are input. For example, instead of a current value flowing to the smoothing reactor, a charging current to the electric-power storage elements 31 can be detected and input.

The power converter according to the first embodiment configured as described above can obtain the following effects.

Figure 4:
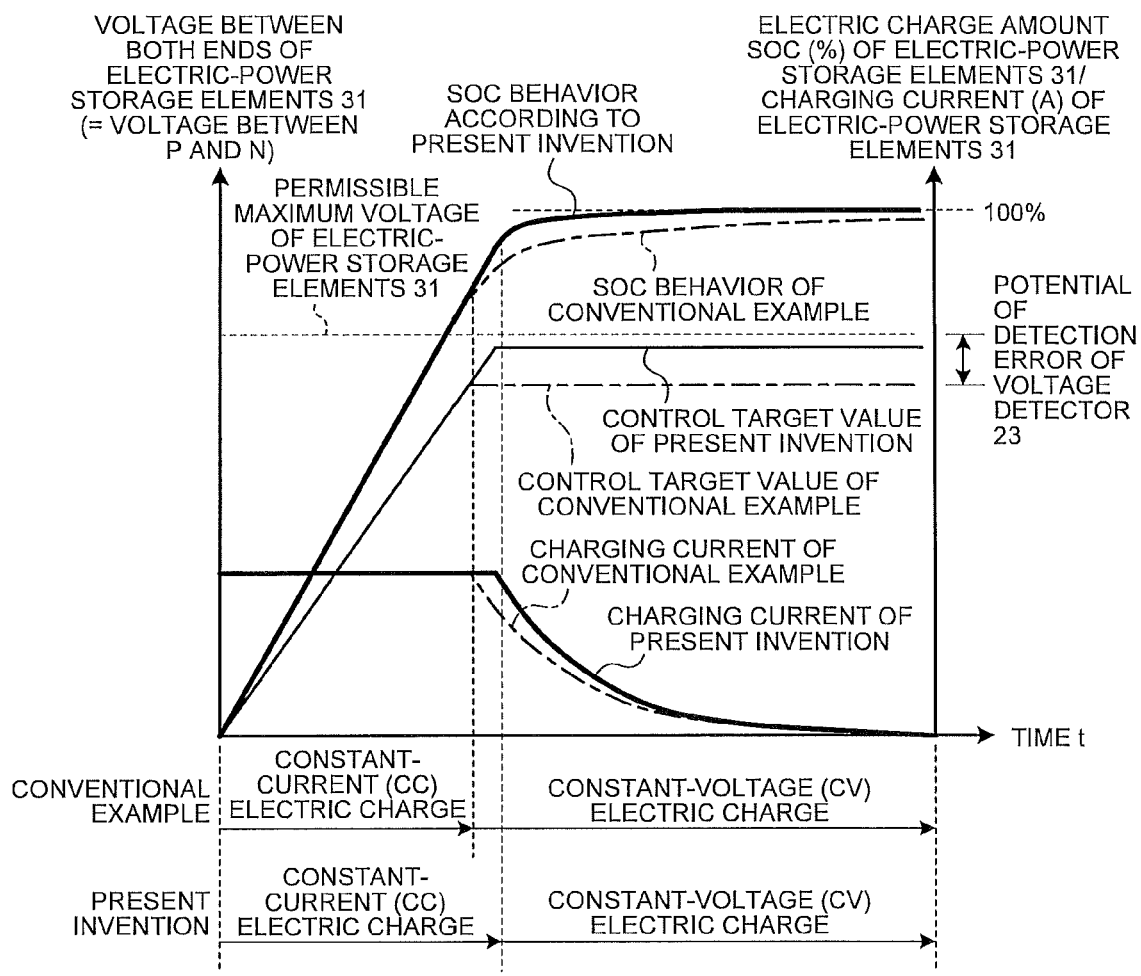
FIG. 4 is an explanatory diagram of an example of an effect of the embodiment of the present invention.

FIG. 4 is an explanatory diagram of an example of an effect of the embodiment of the present invention. More specifically, FIG. 4 depicts a relationship between a voltage between both ends of the electric-power storage elements 31 when the power converter 100 electrically charges to the electric-power storage elements 31, a charging current (=smoothing reactor current ISL) to the electric-power storage elements 31, and the electric charge amount SOC to the electric-power storage elements 31.

In FIG. 4, characteristics shown by a solid line are characteristics when the present invention is applied, and characteristics shown by a dashed line are characteristics of a conventional example.

First, in a region of a constant-current (CC) electric charge immediately after the electric charge is started, the gate controller 44 controls the power converting unit 105 to output a constant current. Therefore, the electric charge amount SOC of the electric-power storage elements 31 increases linearly. In this region, there is no difference between when the present invention is applied and the conventional example.

On the other hand, when the electric charge amount SOC increases and when a voltage between both ends of the electric-power storage elements 31 (total voltage) almost reaches a prescribed permissible maximum voltage, a control is switched from the constant-current (CC) electric charge to a constant-voltage (CV) electric charge. That is, the gate controller 44 constant-voltage controls the power converting unit 105 such that a voltage between the main circuit conductors P and N matches a predetermined control target value.

In this case, according to the conventional example, a control target value of the constant voltage control needs to be determined at a low level by considering a tolerance of the first voltage detector 23. However, in the present invention, the voltage signal BEFC1 having a small voltage-detection delay and high voltage precision is obtained. Therefore, a value infinitely close to the permissible maximum voltage of the electric-power storage elements 31 can be set as a control target value. That is, a control target value of the power converting unit 105 at a constant-voltage (CV) electric charging time can be set higher than that of the conventional example.

With this arrangement, a wide region of a constant-current electric charge can be secured, a charging current can be a maximum, and a time taken to electrically charge to the electric-power storage elements 31 can be shortened from that of the conventional example.

Further, the voltage signal BEFC1 having a small voltage-detection delay and high voltage precision can be obtained as a voltage between the main circuit conductors P and N of the power converter 100. Therefore, by using the voltage signal BEFC1 for processes of the protection processing unit 42, the power converting unit 105 within the power converter 100 can be stopped in high precision at a predetermined value as close as possible to a permissible maximum voltage equal to or lower than a permissible maximum voltage of the electric-power storage elements 31 or at a predetermined value as close as possible to a permissible minimum voltage equal to or higher than a permissible minimum voltage.

With this arrangement, a usable voltage range of the electric-power storage elements 31 can be a maximum limit. Therefore, more electric charge/discharge of electric power becomes possible, and damage of the electric-power storage elements 31 can be prevented.

When the power converter of the present embodiment is applied to an electric rolling stock, both the power converter 100 and the electric-power storage device 30 described above become substantially large devices, and are arranged at separate positions. Therefore, preferably, these devices have configurations particularly prepared for a trouble such as line disconnection of the signal transmission path 37.

Meanwhile, in the present embodiment, the first voltage detector 23 is provided within the power converter 100, and the detection value BEFC from the first voltage detector 23 is directly input to the power conversion controller 40 so as not to pass via the outside of the power converter 100. Therefore, the detection value BEFC from the first voltage detector 23 can be used even when a signal transmission path of each of constituent elements of the electric-power storage controller 33, the signal transmission path 37, and the communication processing unit 57 cannot be used because of a trouble. Consequently, a control can be continued without stopping the operation of the power converting unit 105. As a result, the redundancy and reliability of the power converter 100 can be secured.

In the present embodiment, by providing the first voltage detector 23 within the power converter 100, the detection value BEFC from the first voltage detector 23 can be directly input to the power conversion controller 40 without via the signal transmission path 37, without performing a data conversion such as a serial-parallel conversion via a communication processing unit. As a result, a delay time of a detection value following the data conversion by the communication processing unit 57 can be reduced.

Figure 5:
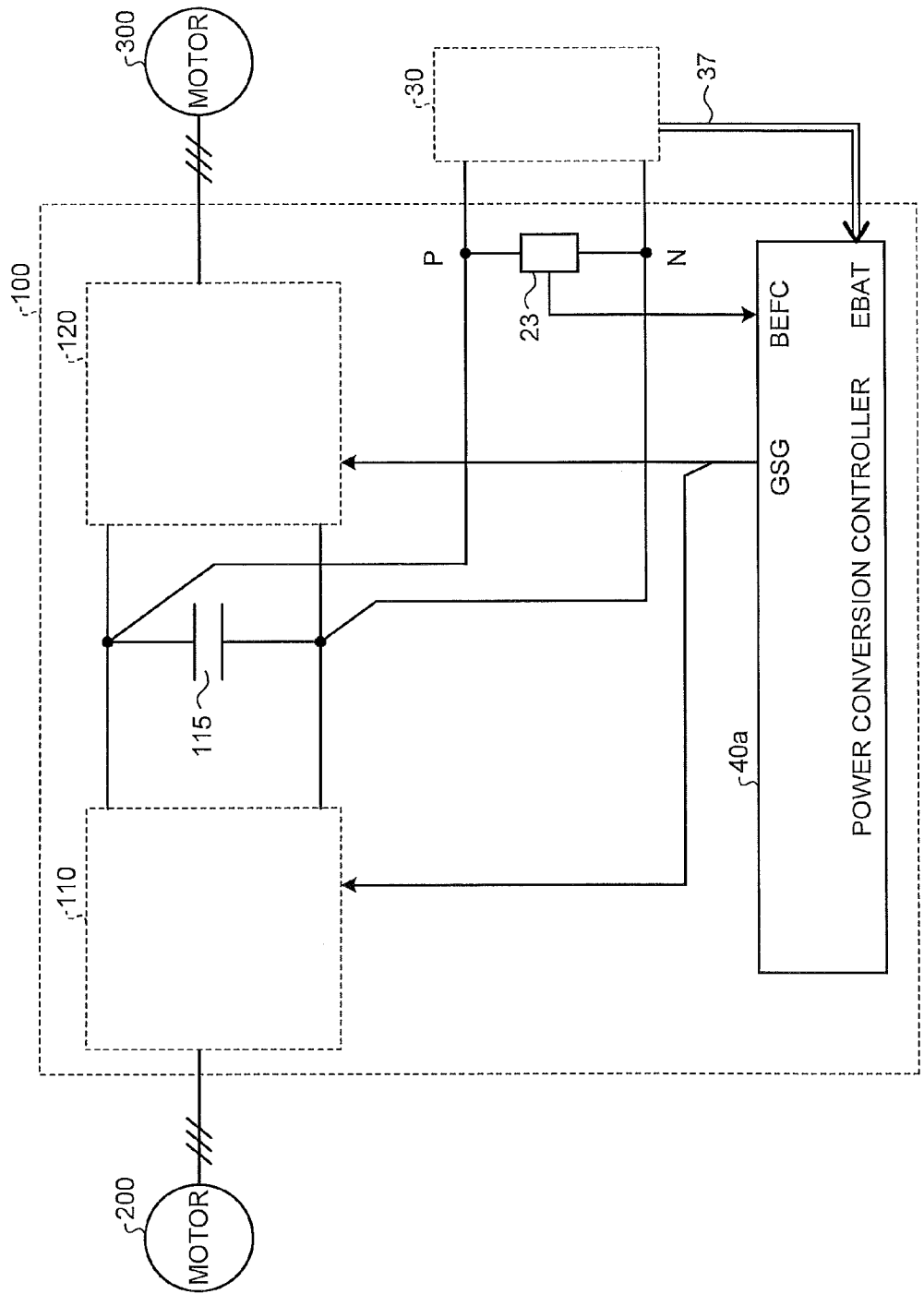
FIG. 5 is a configuration example of another power converter according to the embodiment of the present invention.

In the above explanations, a DC-DC converter is used for the power converting unit 105. As shown in FIG. 5, the invention can be also applied to a configuration in which a DC-DC converter 110 that is connected to an alternate-current power source as an external power source 200 and supplies direct current power adjusted in a predetermined current or voltage to a capacitor 115 is connected to the electric-power storage device 30.

As shown in FIG. 5, the present invention can be also applied to a configuration in which alternate current power is generated from direct current power of the capacitor 115 and is supplied to a motor 300, and to a configuration in which a direct-current side of a DC-AC inverter 120 that reversibly controls a power flow between the direct-current side and an alternate-current side is connected to the electric-power storage device 30.

That is, the power converting unit 105 or the power converter 100 is not limited to modes shown in FIGS. 1 and 5, and can be applied to all modes of power converters that perform a power conversion.

The configuration described in the present embodiment is only an example of the contents of the present invention, and thus it can be combined with other well-known techniques. Further, it is needless to mention that the present invention can be configured while modifying it without departing from the scope of the invention, such as omitting a part the configuration.

Furthermore, in this specification, the contents of the present invention have been explained based on an assumption that the power converter is applied to a technical field of electric railways; however, the applications field of the present invention is not limited thereto, and it is needless to mention that the present invention can be applied to various industrial fields.

INDUSTRIAL APPLICABILITY

As described above, the power converter according to the present invention is useful for a power converter that is connected to an electric-power storage device to which plural electric-power storage elements are connected and has a power converting unit that performs electric charge/discharge to and from the electric-power storage elements.

The invention claimed is:

1. A power converter comprising a power converting unit that is connected to an electric-power storage device to which a plurality of electric-power storage elements are connected and performs electric charge/discharge to and from the electric-power storage device, and a power conversion controller that controls an operation of the power converting unit, wherein
the power conversion controller includes:
a correction-value calculating unit that calculates a correction value or a correction coefficient from a first voltage value detected by a first voltage detector that detects a voltage at a connection point between the power converting unit and the electric-power storage device and from a second voltage value detected by a second voltage detector that is incorporated in the electric-power storage device and detects a voltage in a cell unit or a module unit in each of the electric-power storage elements and having higher precision than that of the first voltage value and having a late response; and
a corrected-voltage calculating unit that calculates a corrected voltage value obtained by correcting the first voltage value by the correction value or the correction coefficient,
a control of the power converting unit is performed based on the corrected voltage value, and
the power converter has a configuration of performing constant-voltage electric charge to the electric-power storage device.

2. The power converter according to claim 1, wherein the correction value is calculated based on a difference between a voltage value obtained by time averaging the first voltage value and a voltage value obtained by time averaging the second voltage value.

3. The power converter according to claim 1, wherein the correction coefficient is calculated based on a ratio of a voltage value obtained by time averaging the first voltage value to a voltage value obtained by time averaging the second voltage value.

4. The power converter according to claim 1, wherein the power conversion controller includes:
a data monitoring unit that monitors whether the second voltage value is a normal value; and
a correction selecting unit that can select whether to correct the first voltage value by the correction value based on an output of the data monitoring unit.

5. The power converter according to claim 1, wherein the power conversion controller includes a limiter unit that limits upper and lower limits of the correction value.

6. The power converter according to claim 1, wherein the power conversion controller includes a gate controller that controls to match the corrected voltage value with a predetermined control target value based on the corrected voltage value.

7. The power converter according to claim 6, wherein
when performing a control to match the corrected voltage value with the control target value, the gate controller controls the power converting unit by outputting a gate signal that causes a voltage supplied from the power converting unit to the electric-power storage device to become a constant voltage.

8. The power converter according to claim 1, wherein the power conversion controller further includes a protection processing unit that outputs a control signal for stopping an operation of the power converting unit to the gate controller when a voltage abnormality of each of the electric-power storage elements is detected based the corrected voltage value.

9. The power converter according to claim 1, wherein the power converting unit is a DC-AC inverter.

10. The power converter according to claim 1, wherein the power converting unit is an AC-DC converter.

11. The power converter according to claim 1, wherein the power converting unit is a DC-DC converter.

12. The power converter according to claim 1, wherein the first voltage detector is provided within an apparatus.

13. The power converter according to claim 2, wherein the first voltage detector is provided within an apparatus.

14. The power converter according to claim 3, wherein the first voltage detector is provided within an apparatus.

15. The power converter according to claim 4, wherein the first voltage detector is provided within an apparatus.

16. The power converter according to claim 5, wherein the first voltage detector is provided within an apparatus.

17. The power converter according to claim 6, wherein the first voltage detector is provided within an apparatus.

18. The power converter according to claim 8, wherein the first voltage detector is provided within an apparatus.

19. The power converter according to claim 9, wherein the first voltage detector is provided within an apparatus.

20. The power converter according to claim 10, wherein the first voltage detector is provided within an apparatus.

21. The power converter according to claim 11, wherein the first voltage detector is provided within an apparatus.

* * * * *